United States Patent
Lai (10) Patent No.: US 7,098,543 B2
(45) Date of Patent: Aug. 29, 2006

(54) FLIP-CHIP PACKAGED SMD-TYPE LED WITH ANTISTATIC FUNCTION AND HAVING NO WIRE BONDING

(75) Inventor: Mu-Jen Lai, Chungli (TW)

(73) Assignee: Supernova Optoelectronics Corporation, Taoyuan (TW)

( * ) Notice: Subject to any disclaimer, the term of this patent is extended or adjusted under 35 U.S.C. 154(b) by 137 days.

(21) Appl. No.: 10/982,767

(22) Filed: Nov. 8, 2004

(65) Prior Publication Data

US 2006/0012053 A1    Jan. 19, 2006

(30) Foreign Application Priority Data

Jun. 29, 2004    (TW) .............................. 93210210 U (51) Int. Cl.
  *H01L 29/40*    (2006.01)
(52) U.S. Cl. ................ 257/778; 257/666; 257/E23.001
(58) Field of Classification Search ................ 257/666, 257/778
  See application file for complete search history.

(56) References Cited

U.S. PATENT DOCUMENTS

| | | | |
|---|---|---|---|
| 6,876,008 B1 * | 4/2005 | Bhat et al. ..................... | 257/99 |
| 6,949,773 B1 * | 9/2005 | Shin ............................ | 257/99 |
| 2004/0026708 A1 * | 2/2004 | Chen ........................... | 257/99 |

* cited by examiner

*Primary Examiner*—Roy Potter
(74) *Attorney, Agent, or Firm*—Rosenberg, Klein & Lee (57) ABSTRACT

A flip-chip packaged SMD-type (surface-mount device) light emitting diode is provided. The light emitting diode chip is packaged in flip chip packages and is connected with an electrostatic protection device such as a transient voltage suppressor (TVS) or a Zener diode. The electrostatic protection device is attached with a substrate so as to form a flip-chip packaged SMD-type light emitting diode. The light emitting diode chip is connected to a lead frame of the substrate by a high electrical and heat conductive component thus the device needs no wire bonding. Due to the electrostatic protection device, the device has static control effect.

35 Claims, 6 Drawing Sheets

FLIP-CHIP PACKAGED SMD-TYPE LED WITH ANTISTATIC FUNCTION AND HAVING NO WIRE BONDING

BACKGROUND OF THE INVENTION

The present invention relates to a flip-chip packaged SMD-type (surface-mount device) light emitting diode, especially to a light emitting diode having an electrostatic protection device with function of standing electrostatic discharge (ESD) and without the need of wire bonding.

Light emitting diode (LED) is a fine solid-state light source made of semiconductor material. The device that turns electricity into light features on the compact structure, long lifetime, low driving voltage, fast response, and good shock resistance. It can also be applied in various appliances with light weight and compact design and is quite popular in our daily lives.

According to wavelength, LED is divided into visible LED and invisible LED. The visible LED is used for display. Moreover, the general LED and high brightness LED are differentiated by the brightness—one candle. The former is applied to indoor display systems while the later is suitable for outdoor display such as center high-mounted stop lamp, outdoor LED display and traffic signs. And the invisible light such as infrared LED is applied to sensor for defecting the size of copy paper, remote control of home appliances, auto-detection in plants, automatic doors and auto flush controllers.

During mass production of LED devices, the production of LED are divided into the upper, middle, and the lower streams. The main products of the upper stream are single chips and epi-wafers. Single crystals are substrate for raw materials and most of them are binary III-V group compound semiconductor such as gallium arsenide (GaAs) or gallium phosphide (GaP). While the epi-wafers are multiple layers of single crystal films with various thickness growing on the single crystal substrate such as AlxGa1-xAs/GaAs, AlxGayIn1-x-yP/GaAs, and InxGa1-xN/GaN. The common techniques used include Liquid Phase Epitaxy (LPE) and Metal Organic Vapor Phase Epitaxy (MOVPE). During the middle stream, according to the demands for the device, the epitaxy wafer is etched and metallized, and then cut into individual chips. The techniques used include photomask etching, dry/wet etching, vacuum evaporation and dicing. The lower stream means the packaging process. The chips are attached on the leadframe and then are packaged to form lamps, digit displays, dot matrix LED or surface mount devices.

Figure 1:
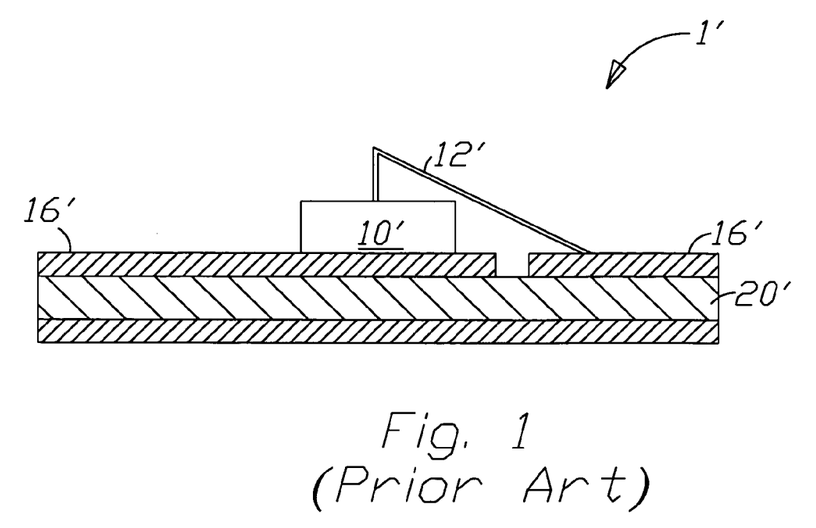
FIG. 1 is a schematic diagram showing the structure of a SMD (surface-mount device)-type light emitting diode of a prior art.

Refer to FIG. 1, a conventional surface-mount device LED is disclosed. The LED 1' is composed of a LED chip 10' is on top of an electrode 16' over a circuit board 20'. The LED chip 10' is electrically connected with the electrode 16'by a wire 12'.

As to the gallium nitride-based III-V group compound semiconductor device using the sapphire substrate, the p-type electrode and the n-type electrode needs to be configured on the same side of the device. Thus the upward light-emitting surface of the devices packaged by conventional methods is shielded by electrodes, and lead to a certain upward light loss. The so-called flip chip structure is reversing the device and set a reflecting layer with higher reflectance on top of the p-type electrode. Thus the light originally emitted from the top of the device can also be emitted from other surface such as the top of the sapphire substrate. Thus the light loss on the electrode is reduced so that more light is emitted, compared with the device made by traditional packaging method. On the other hand, inside the flip chip structure, the heat dissipation structure of the package structure contacts the electrodes or bumps directly, the heat dissipation efficiency of the device is dramatically improved so as to avoid destruction of the device caused by heat.

Figure 2:
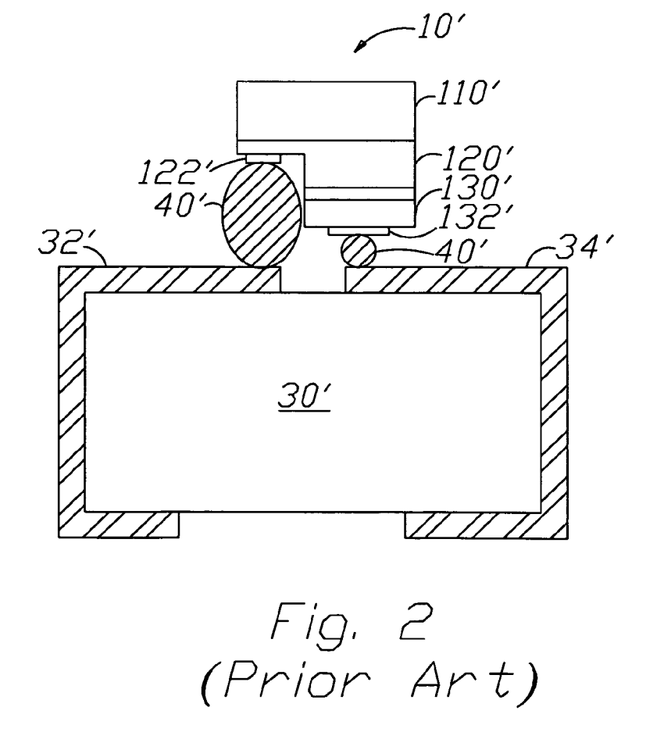
FIG. 2 is a schematic diagram of a flip-chip packaged light emitting diode of a prior art.

Refer to FIG. 2, a schematic diagram of a prior art of conventional LED flip-chip products is disclosed. The device is composed of a LED chip 10', placed on a base 30'. The LED chip 10' having a substrate 110', a first conductivity type semiconductor layer 120', a second conductivity type semiconductor layer 130', a first electrode 122' formed on a confining area of the first conductivity type semiconductor layer 120', a second electrode 132' formed on a confining area of the second conductivity type semiconductor layer 130'. Two metal solders 40' are arranged between a first lead frame 32' and the first electrode 122', a second lead frame 34' the second electrode 132' respectively.

Figure 3:
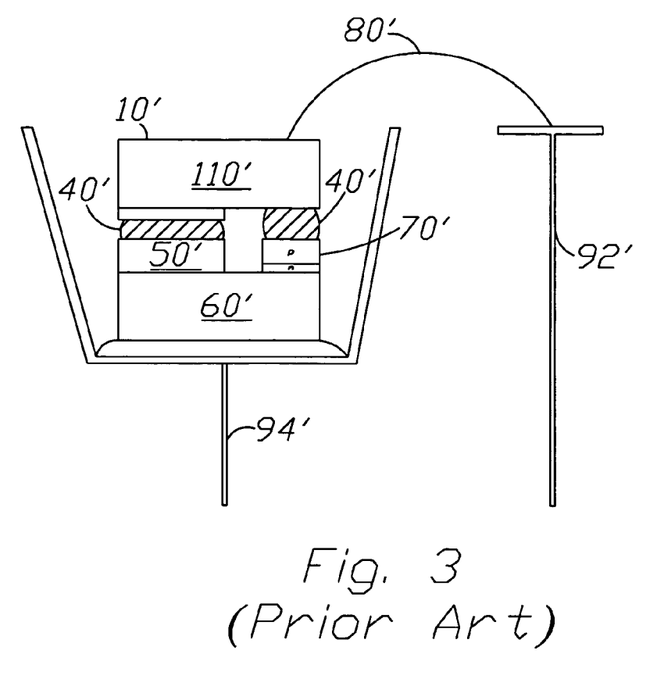
FIG. 3 is a schematic diagram of a lead-type light emitting diode of a prior art.

Furthermore, a package structure of LED with protection device is disclosed in Taiwanese application No. 091103964, dated Jul. 5, 2002. Refer to FIG. 3, a structure of conventional lead-type LED flip chip products is shown. The device comprises a LED chip 10' connected with an electrical and heat conductive pad 50' by a solder 40' while the electrical and heat conductive pad 50' is attached on an electrical and heat conductive base substrate 60'. The n-type electrode of the LED chip 10' connects with an electrostatic protection device 70' by a solder 50'. The LED chip 10' further includes an electrically conductive substrate 110'. By a wire 80', the LED chip 10' is connected with a second lead frame 92' while the electrical and heat conductive base substrate 60' is connected with a first lead frame 94'.

Figure 3A:
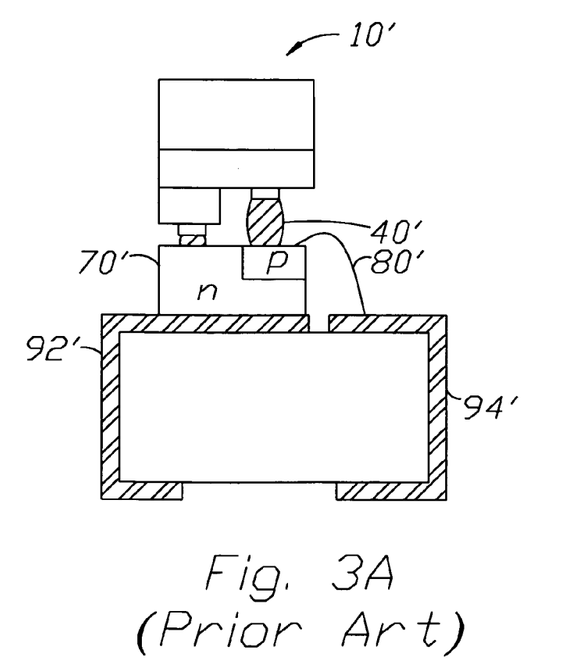
FIG. 3A is a schematic diagram of a SMD-type light emitting diode with an electrostatic protection device of a prior art.

A conventional SMD (surface-mount device)-type LED with an electrostatic protection device is disclosed in FIG. 3A. The LED chip 10' is connected with the electrostatic protection device 70' by a solder 50' while the electrostatic protection device 70' is further connected with the first lead frame 94' by the wire 80'. The above embodiment has the following disadvantages:

1. A stress appears during the wire bonding process of the device and causes the deformation or destruction of the devices so that the yield rate is reduced.
2. After wire bonding, a packaging process is performed. After the packaging, the wire always falls off. Thus this also causes the reduction of the yield rate.
3. Due to the need of wire bonding, the thickness of the light-emitting device can't be dramatically reduced.

Therefore, there is a need for improving the conventional flip-chip packaged light emitting diode. A flip-chip packaged SMD-type LED with antistatic function and having no wire bonding is provided to improve the above defects of wire bonding and also reduce the package area.

SUMMARY OF THE INVENTION

It is a primary object of the present invention to provide a flip-chip packaged SMD-type LED with antistatic function and having no wire bonding that is packaged in flip chip packages so as to make the p-type electrode and the n-type electrode locate at the same side. An electrostatic protection device and a high electrical and heat conductive component are connected with the light emitting diode so as to avoid the problem of wire bonding and have a good static control effect.

In order to achieve above object, a flip-chip packaged SMD-type LED with antistatic function and having no wire bonding is provided. The invention includes a light emitting diode packaged in flip chip packages, an electrostatic protection device such as a transient voltage suppressor (TVS) or a Zener diode connected with the light emitting diode. Then the electrostatic protection device is attached with a substrate to form a flip-chip packaged SMD-type LED. The light emitting diode is connected to a lead frame of the substrate by a high electrical and heat conductive component thus the invention needs no wire bonding. Due to the electrostatic protection device, the invention has static control effect.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFFERED EMBODIMENT

The present invention features on that an electrostatic protection device with static control effect and avoid the wire bonding problems of conventional SMD-type light emitting diode.

Figure 4:
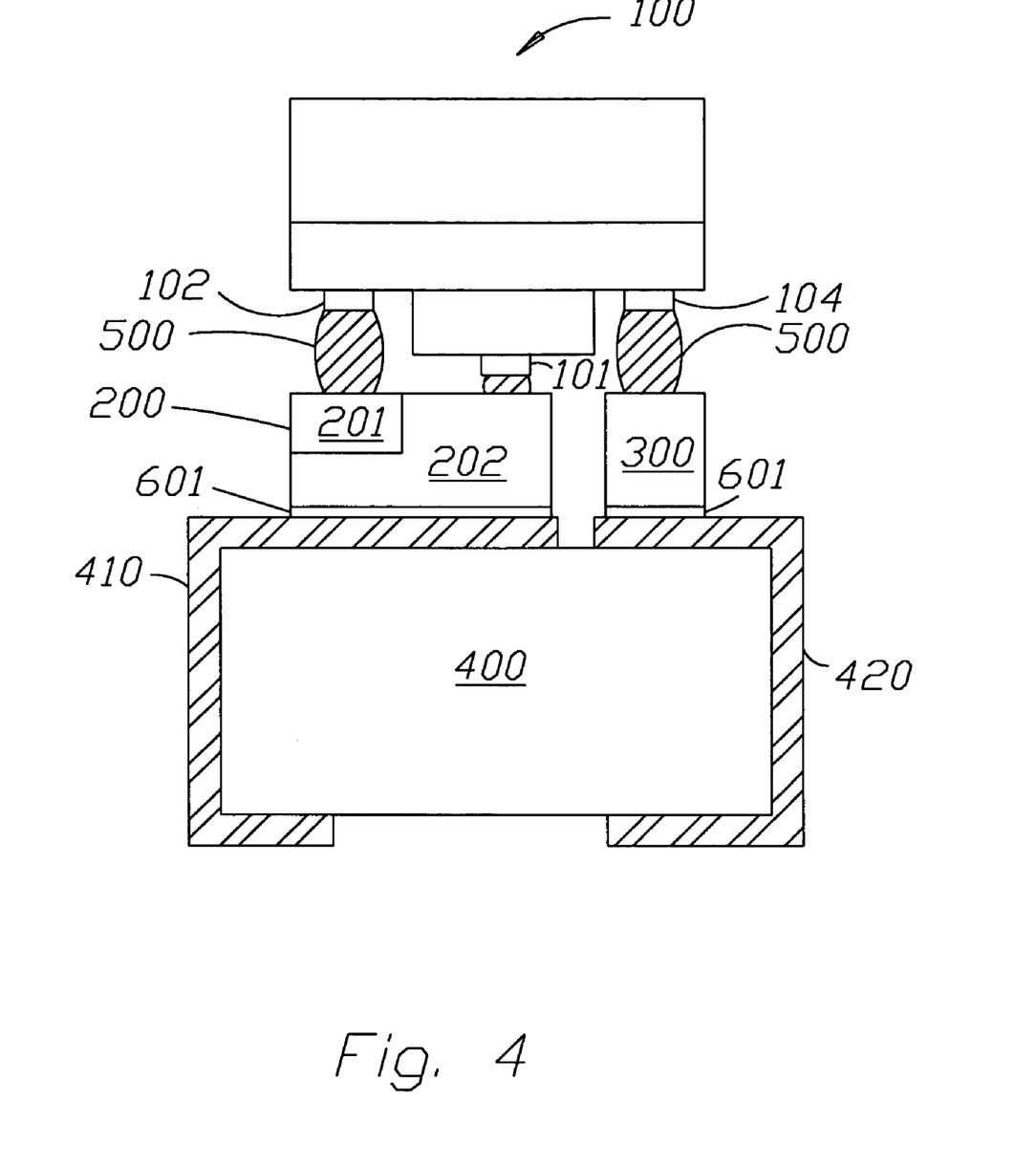
FIG. 4 is a schematic diagram of an embodiment of a light emitting diode with a Zener diode in accordance with the present invention.

Refer to FIG. 4, a better embodiment of the present invention is disclosed. A SMD-type LED of the present invention includes a chip of gallium nitride-based III–V group compound semiconductor light-emitting device 100, an electrostatic protection device 200 such as a Zener diode, a high electrical and heat conductive component 300 and a high electrical and heat conductive base substrate 400 having a first lead frame 410 and a second lead frame 420. In this embodiment, the chip of gallium nitride-based III–V group compound semiconductor light-emitting device 100 includes a second p-type electrode 101, and two n-type electrodes apart from each other—a second n-type electrode 102 and a third n-type electrode 104, all located at the same side. The electrostatic protection device 200 having a first p-type electrode 201 and a first n-type electrode 202, both set on the same side.

While the second p-type electrode 101 and the second n-type electrode 102 are connected with the first n-type electrode 202 of the electrostatic protection device 200 and the first p-type electrode 201 of the electrostatic protection device 200 respectively by a solder or a bump 500. The electrodes are connected in parallel and reverse direction. The electrostatic protection device 200 is connected with a first lead frame 410 by high conductive paste 601. While the third n-type electrode 104 of the chip of light-emitting gallium nitride-based III–V group compound semiconductor device 100 is joined with the high electrical and heat conductive component 300 by the solder or the bump 500. The high electrical and heat conductive component 300 is connected with a second lead frame 420 by high conductive paste 601. Therefore, a wireless LED flip chip structure with the function of protection ESD (electrostatic discharge) is formed.

Figure 5:
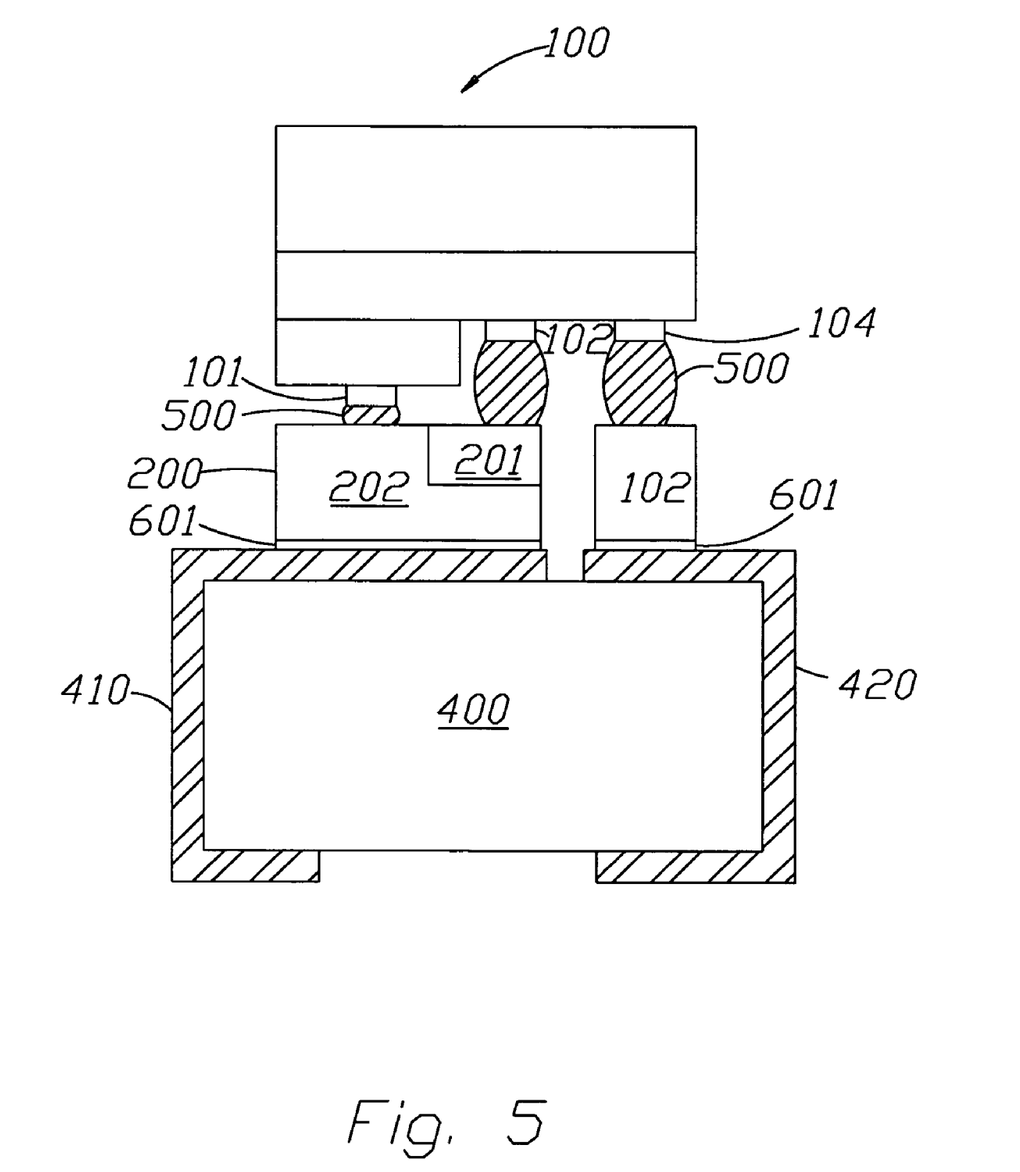
FIG. 5 is a schematic diagram of another embodiment of a light emitting diode with a Zener diode in accordance with the present invention.

Refer to FIG. 5, another embodiment of the present invention is disclosed. The embodiment includes a chip of light-emitting gallium nitride-based III–V group compound semiconductor device 100, an electrostatic protection device 200 such as a Zener diode, a high electrical and heat conductive component 300 and a high electrical and heat conductive base substrate 400 with a first lead frame 410 and a second lead frame 420. In this embodiment, the chip of gallium nitride-based III-V group compound semiconductor light-emitting device 100 includes a second p-type electrode 101, two contiguous n-type electrodes-a second n-type electrode 102, and a third n-type electrode 104, all located at the same side.

The electrostatic protection device 200 having a first p-type electrode 201 and a first n-type electrode 202, both set on the same side. While the second p-type electrode 101 and the second n-type electrode 102 are connected with the first n-type electrode 202 of the electrostatic protection device 200 and the first p-type electrode 201 of the electrostatic protection device 200 respectively by a solder or a bump 500. The electrodes are connected in parallel and reverse direction. The electrostatic protection device 200 is connected with a first lead frame 410 by high conductive paste 601. While the third n-type electrode 104 of the chip of gallium nitride-based III–V group compound semiconductor light-emitting device 100 is joined with the high electrical and heat conductive component 300 by the solder or the bump 500. The high electrical and heat conductive component 300 is connected with a second lead frame 420 by high conductive paste 601. Therefore, a wireless LED flip chip structure with the function of protection ESD (electrostatic discharge) is formed.

Figure 6:
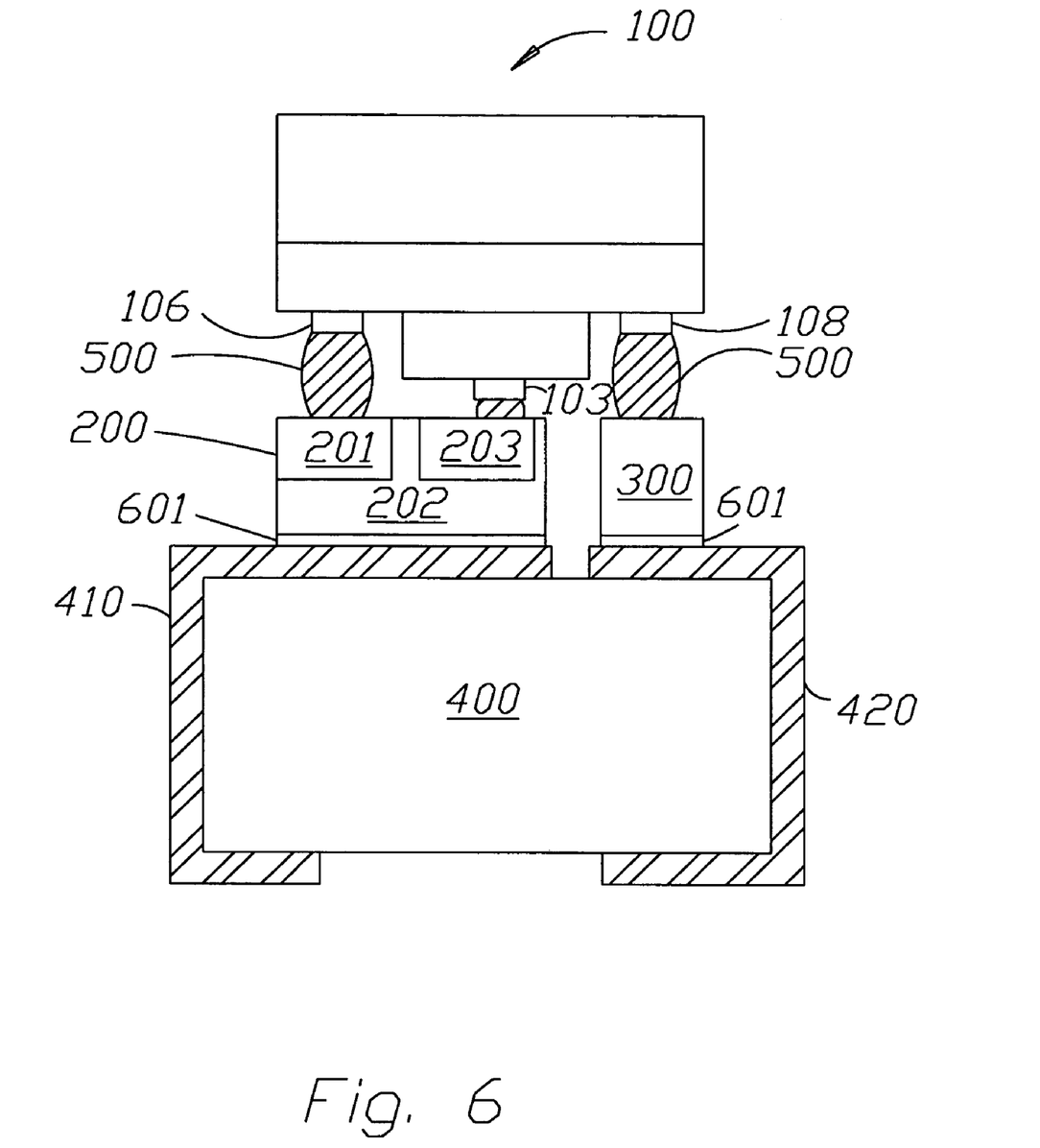
FIG. 6 is a schematic diagram of an embodiment of a light emitting diode with a transient voltage suppressor in accordance with the present invention.
Figure 7:
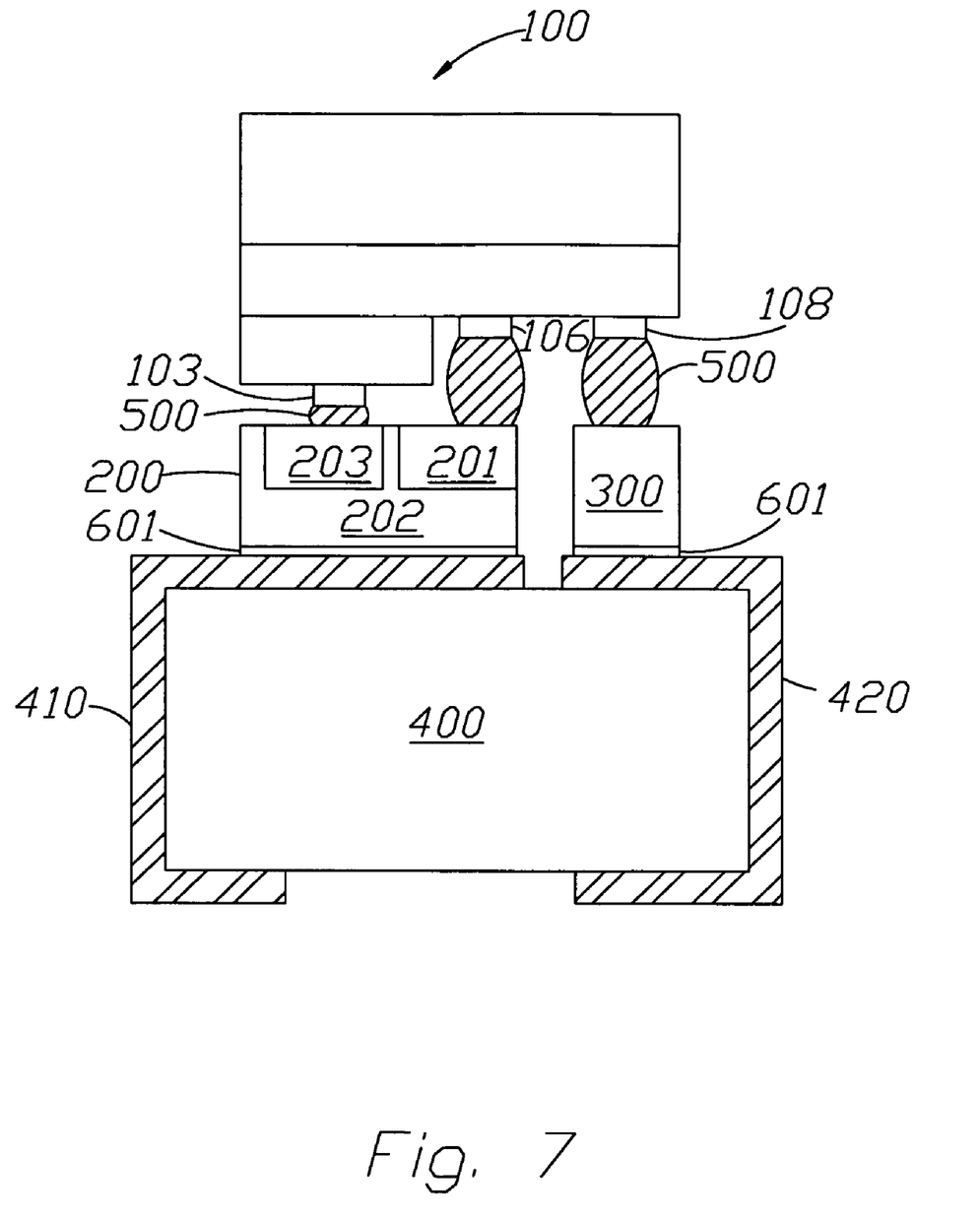
FIG. 7 is a schematic diagram of another embodiment of a light emitting diode with a transient voltage suppressor in accordance with the present invention.

Moreover, refer to FIG. 6 & FIG. 7, an electrostatic protection device 200 of the present invention is a transient voltage suppressor (TVS). The electrostatic protection device 200 includes a first n-type electrode 202, a first p-type electrode 201 and a second p-type electrode 203. The chip of gallium nitride-based III–V group compound semiconductor light-emitting device 100 is composed of a second n-type electrode 106, a third n-type electrode 108, and a third p-type electrode 103. The first n-type electrode 202 of the electrostatic protection device 200 is connected to the first lead frame 410. While the second n-type electrode 106, the third p-type electrode 103, and the third n-type electrode 108 are connected with the first p-type electrode 201, the second p-type electrode 203 and the high electrical and heat conductive component 300 respectively. The first n-type electrode 202, the first p-type electrode 201 and the second p-type electrode 203 of the electrostatic protection device 200 are all located at the same side while the third p-type electrode 103, the second n-type electrode 106, and the third n-type electrode 108 of the chip of gallium nitride-based III–V group compound semiconductor light-emitting device 100 are disposed on the same side. The locations of the second n-type electrode 106 and the third n-type electrode 108 are shown in FIG. 6 & FIG. 7.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A flip-chip packaged surface-mounted device light emitting diode with antistatic function and having no wire bonding comprising
   a high electrical and heat conductive base substrate with a first lead frame and a second lead frame;
   an electrostatic protection device having a first p-type electrode and a first n-type electrode while said first n-type electrode is connected with said first lead frame;
   a light emitting diode having a second p-type electrode, a second n-type electrode and a third n-type electrode;
   said second p-type electrode is connected with said first n-type electrode of said electrostatic protection device and said second n-type electrode is connected with said first p-type electrode; and
   a high electrical and heat conductive component connected with said second lead frame and said third n-type electrode of said light emitting diode.

2. The device according to claim 1, wherein said electrostatic protection device is a Zener diode.

3. The device according to claim 1, wherein said first p-type electrode and said first n-type electrode are disposed on the same side.

4. The device according to claim 1, wherein said second p-type electrode, said second n-type electrode and said third n-type electrode are disposed on the same side while said second n-type electrode is disposed apart from said third n-type electrode.

5. The device according to claim 1, wherein said light emitting diode is a light-emitting gallium nitride-based III–V group compound semiconductor device.

6. The device according to claim 1, wherein said light emitting diode is connected with said electrostatic protection device by a solder or a bump.

7. The device according to claim 1, wherein said first lead frame is connected with said electrostatic protection device by high conductive paste.

8. The device according to claim 1, wherein said third electrode is connected with said high electrical and heat conductive component by a solder or a bump.

9. The device according to claim 1, wherein said high electrical and heat conductive component is connected with said second lead frame by high conductive paste.

10. A flip-chip packaged surface-mounted device light emitting diode with antistatic function and having no wire bonding comprising
    a high electrical and heat conductive base substrate with a first lead frame and a second lead frame;
    an electrostatic protection device having a first p-type electrode, a second p-type electrode and a first n-type electrode while said first n-type electrode is connected with said first lead frame;
    a light emitting diode having a third p-type electrode, a second n-type electrode and a third n-type electrode;
    said third p-type electrode is connected with said second p-type electrode of said electrostatic protection device and said second n-type electrode is connected with said first p-type electrode; and
    a high electrical and heat conductive component connected with said second lead frame and said third n-type electrode of said light emitting diode.

11. The device according to claim 10, wherein said electrostatic protection device is a transient voltage suppressor (TVS).

12. The device according to claim 10, wherein said first p-type electrode, said second p-type electrode and said first n-type electrode are disposed on the same side.

13. The device according to claim 10, wherein said third p-type electrode, said second n-type electrode and said third n-type electrode are disposed on the same side while said second n-type electrode is arranged apart from said third n-type electrode.

14. The device according to claim 10, wherein said light emitting diode is a light-emitting gallium nitride-based III–V group compound semiconductor device.

15. The device according to claim 10, wherein said light emitting diode is connected with said electrostatic protection device by a solder or a bump.

16. The device according to claim 10, wherein said first lead frame is connected with said electrostatic protection device by high conductive paste.

17. The device according to claim 10, wherein said third electrode is connected with said high electrical and heat conductive component by a solder or a bump.

18. The device according to claim 10, wherein said high electrical and heat conductive component is connected with said second lead frame by high conductive paste.

19. A flip-chip packaged surface-mounted device light emitting diode with antistatic function and having no wire bonding comprising
    an electrical and heat conductive base substrate with a first lead frame and a second lead frame;
    an electrostatic protection device connected with said first lead frame;
    a light emitting diode connected with said electrostatic protection device; and
    a high electrical and heat conductive component connected with said second lead frame and said light emitting diode.

20. The device according to claim 19, wherein said electrostatic protection device is a transient voltage suppressor (TVS).

21. The device according to claim 19, wherein said electrostatic protection device is a Zener diode.

22. The device according to claim 19, wherein said electrostatic protection device having a first p-type electrode and a first n-type electrode.

23. The device according to claim 19, wherein said electrostatic protection device having a first p-type electrode, a second p-type electrode and a first n-type electrode.

24. The device according to claim 19, wherein said first n-type electrode is connected with said first lead frame.

25. The device according to claim 23, wherein said first n-type electrode is connected with said first lead frame.

26. The device according to claim 22, wherein said first p-type electrode and said first n-type electrode are disposed on the same side.

27. The device according to claim 23, wherein said first p-type electrode, said second p-type electrode and said first n-type electrode are disposed on the same side.

28. The device according to claim 19, wherein said light emitting diode having a second p-type electrode, a second n-type electrode and a third n-type electrode.

29. The device according to claim 19, wherein said light emitting diode having a third p-type electrode, a second n-type electrode and a third n-type electrode.

30. The device according to claim 28, wherein said second p-type electrode, said second n-type electrode and said third n-type electrode are disposed on the same side while said second n-type electrode is disposed apart from said third n-type electrode.

31. he device according to claim 29, wherein said third p-type electrode, said second n-type electrode and said third n-type electrode are disposed on the same side while said second n-type electrode is disposed apart from said third n-type electrode.

32. The device according to claim 19, wherein said light emitting diode is a light-emitting gallium nitride-based III–V group compound semiconductor device.

33. The device according to claim 19, wherein said light emitting diode is connected with said electrostatic protection device by a solder or a bump.

34. The device according to claim 19, wherein said first lead frame is connected with said electrostatic protection device by high conductive paste.

35. The device according to claim 19, wherein said high electrical and heat conductive component is connected with said second lead frame by high conductive paste.

* * * * *